United States Patent Office 3,543,389

Patented Dec. 1, 1970

3,543,389

METHOD FOR CLEANING METAL SURFACES

Gerard A. Baldauf, Wernersville, and Michael J. Elkind, Wyomissing, Pa., assignors to Bell Telephone Laboratories, Incorporated, Murray Hill and Berkeley Heights, N.J., a corporation of New York No Drawing. Continuation of application Ser. No. 563,989, July 11, 1966. This application July 7, 1969, Ser. No. 871,764.
Int. Cl. B23k 1/20, 31/02
U.S. Cl. 29—488 2 Claims

ABSTRACT OF THE DISCLOSURE

The specification discloses a method of bonding one gold-plated surface to another which includes cleaning the surfaces, placing them in contact and heating the contacting surfaces with or without compression until a bond is formed wherein the bonding effectiveness between gold surfaces is increased by cleaning with a solution containing dibasic ammonium citrate, cyanide, and a chelating agent such as EDTA.

This is a continuation of copending application of Gerard A. Baldauf and Michael J. Elkind, Ser. No. 563,-989, filed July 11, 1966, now abandoned.

This invention relates to methods for cleaning and brightening metal surfaces using novel chemical cleaning agents. It is especially useful for preparing metal surfaces of electrical devices, particularly gold, silver and alloys thereof, for subsequent bonding of electrodes and metal members such as supports.

The manufacture of various semiconductor devices requires the attachment of a metal plated semiconductor wafer to a metal, or metal-plated, header. Such attachment is usually performed by eutectic or thermocompression bonding to provide mechanical strength and optimum electrical characteristics. In most cases a pure metal or alloy preform is used which is merely a metal foil member placed between the wafer and the header and composed of a metal to which both the wafer and header are readily bondable. For these purposes the surface of the metal being bonded is usually gold and it is this species to which this invention is principally directed.

The usual cause of failure in metal-to-metal bonding of this nature is surface contamination. Much attention has been given to this problem in terms of chemical formulations for preparing the surface for bonding. This invention is directed to a method for cleaning metal surfaces, particularly gold and gold-containing surfaces, with a novel chemical cleaning solution preparatory to bonding. The novel cleaning solution, which itself forms the basis for one aspect of the invention, contains a stable soluble cyanide such as sodium or potassium cyanide, a buffering agent—dibasic ammonium citrate (DAC) and a chelating agent selected from the following group: ethylenediaminetetraacetic acid (EDTA) and the tetrasodium salt ($Na_4EDTA$) thereof, diethylenetriamine pentaacetic acid (DTPA) and the pentasodium salt ($Na_5DTPA$) thereof, and the trisodium salt of N-hydroxyethylethylene diaminetriacetic acid ($Na_3HETA$). Each of the three constituents is present in an amount in the range of 8 to 15 grams per liter. These formulations were found to significantly improve the bondability of gold-plated wafers to gold-plated headers.

These solutions were also found to be effective for cleaning silver-plated wafers prior to bonding. They are also useful to brighten gold, silver, and gold-silver alloys and for cleaning mildly oxidized Kovar.

The effectiveness of the cleaning solutions of this invention was evaluated in terms of the ability of a cleaning treatment to improve the bondability of gold-plated wafers to a gold-plated molybdenum header. Ease of bonding, the physical appearance of the resulting alloy fillet, and the strength of attachment determined by a manual probe, were the criteria employed to evaluate the cleaning ability of the various compositions.

Five hundred gold-plated germanium wafers were subjected to each of ten cleaning solutions. In each case a gold-germanium preform was used to provide for eutectic bonding. The gold-plated headers and gold-germanium preforms were ultrasonically degreased in freon. All wafers in groups of fifty were then treated in 50 ml. of boiling cleaning solution for fifteen minutes, followed by a thorough hot deionized water cascade rinse, and drying. The bonding cycles for the several samples were as follows:

15 seconds to 180° C.
15 seconds 180° C. to 420° C.
15 seconds 420° C. to 520° C.

This cycle is merely typical of the well-known method of eutectic bonding and no criticality is attached to these parameters in terms of the effectiveness of the cleaning solution of this invention to improve the bond.

The results of these treatments are tabulated in Table I.

TABLE I.—WAFER CLEANING SOLUTION EVALUATIONS

| Formula | Composition | Stability of solution (room temp.) | Bondability improvement of hard oxide silicon wafers |
|---|---|---|---|
| 1 | KCN | Good [1] | Slight.[2] |
| 2 | DAC | do [1] | None. |
| 3 | KCN+DAC | Poor [3] | Fair. |
| 4 | $Na_4EDTA$ | Good [1] | None. |
| 5 | KCN+$Na_4EDTA$ | do [1] | Slight. |
| 6 | KCN+DAC+$Na_4EDTA$ | Fair | Optimum. |
| 7 | KCN+DAC+$Na_5DTPA$ | do | Significant. |
| 8 | KCN+DAC+$Na_3HETA$ | do | Do. |
| 9 | KCN+DAC+EDTA | Good [1] | Do. |
| 10 | KCN+DAC+DTPA | do [1] | Do. |

[1] Solution remained clear at least 24 hours.
[2] Gold-plate dissolved completely on some wafers.
[3] Solution turned color in less than 24 hours.

For these evaluations the concentration of each ingredient was kept constant at 12 grams per liter although the concentrations may be varied between the limits of 8 grams per liter and 15 grams per liter and a satisfactory result will be obtained.

The results indicate that solutions containing the acetic acid complex chelating agent are most effective and also that the three ingredients in Formulas 6 through 10 are critical. The most efficient wafer cleaning solution was Formula 6 containing potassium cyanide, dibasic ammonium citrate and the tetrasodium salt of ethylenediaminetetraacetic acid. On the basis of the bonding criteria previously described, wafers cleaned in this solution bonded readily to give substantially 100 percent yields.

Equal success was achieved with the cleaning solution of this invention when used for surface treatment of gold-plated silicon wafers prior to thermocompression bonding. The bonding conditions used to verify this were approximately 330° C. and 6000 p.s.i. Again bonding yields were 100 percent on the basis of 10,000 wafers processed. Useful bonding conditions lie in the range of 315° C. to 380° C. and 4200 p.s.i. to 7200 p.s.i.

To insure achievement of optimum electrical characteristics, the cleaning solution should be completely removed from the treated surfaces after bonding. A thorough rinse with 180° F. water is adequate.

The foregoing chemical formulations are only exemplary in certain respects. For instance the cation associated with the cyanide ion is not critical in these solutions since it merely determines the extent of dissociation of the compound. However, there is an advantage in the processing of various semiconductor devices and avoiding potassium and sodium cations which in some cases can adversely affect the electrical properties of the finished device. Consequently stable water-soluble ionic organic cyanides would be beneficial from this standpoint. For the purposes of this invention it is necessary only to prescribe a soluble cyanide within the concentration limits specified, the particular cation depending upon the choice of the user, the availability of the compound and the specific use to which the invention is directed.

Various additional modifications and extensions of this invention will become apparent to those skilled in the art. All such variations and deviations which basically rely on the teachings through which this invention has advanced the art are properly considered within the spirit and scope of this invention.

What is claimed is:

1. An improved method for bonding one gold plated surface to another which comprises chemically cleaning the gold surfaces, placing them in contact and heating the contacting surfaces with or without compression until a bond is formed, the improvement characterized in that the cleaning step is carried out by contacting one or both gold surfaces with a cleaning solution consisting essentially of a water solution containing the following ingredients each in a concentration of 8 to 15 grams per liter of water: a soluble cyanide, dibasic ammonium citrate, and a chelating agent selected from the group consisting of ethylenediaminetetraacetic acid and the tetrasodium salt thereof, diethylenetriaminepentaacetic acid and the pentasodium salt thereof, and the trisodium salt of N-hydroxyethylethenediaminetriacetic acid.

2. The method of claim 1 wherein the cyanide is potassium cyanide and the chelating agent is the tetrasodium salt of ethylenediaminetetraacetic acid.

References Cited

UNITED STATES PATENTS

| | | | |
|---|---|---|---|
| 2,098,744 | 11/1937 | Fiske | 252—135 |
| 2,287,050 | 6/1942 | Miller | 252—142 |
| 3,031,747 | 5/1962 | Green | 29—488 X |
| 3,063,944 | 11/1962 | Zussman et al. | 252—79.1 |
| 3,199,189 | 8/1965 | Plante | 29—488 |
| 3,242,090 | 3/1966 | Grunwald | 252—141 |
| 3,242,093 | 3/1966 | Compton | 252—142 |
| 3,297,580 | 1/1967 | Pitzer | 252—142 |

JOHN F. CAMPBELL, Primary Examiner

R. J. SHORE, Assistant Examiner

U.S. Cl. X.R.

134—2; 252—79.1, 141